US012796528B2

(12) United States Patent
Hsieh et al.

(10) Patent No.: US 12,796,528 B2
(45) Date of Patent: Nov. 10, 2026

(54) MILLIMETER-WAVE PASSIVE CIRCUIT DESIGNS WITH WAFER-LEVEL CHIP-SCALE PACKAGE

(71) Applicant: Taiwan Semiconductor Manufacturing Company, Ltd., Hsinchu (TW)

(72) Inventors: Hsieh-Hung Hsieh, Taipei City (TW); Chen Cheng Chou, Hsinchu (TW); Hwa-Yu Yang, Hsinchu (TW); Ming-Da Cheng, Hsinchu (TW); Ru-Shang Hsiao, Hsinchu (TW); Tzu-Jin Yeh, Hsinchu (TW); Ching-Hui Chen, Hsinchu (TW); Shenggao Li, Cupertino, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 714 days.

(21) Appl. No.: 18/309,277

(22) Filed: Apr. 28, 2023

(65) Prior Publication Data

US 2024/0363461 A1 Oct. 31, 2024

(51) Int. Cl.

| | |
|---|---|
| ***H10W 74/10*** | (2026.01) |
| ***H10D 89/10*** | (2025.01) |
| ***H10W 44/20*** | (2026.01) |
| ***H10W 70/63*** | (2026.01) |
| ***H10W 72/30*** | (2026.01) |
| ***H10W 90/00*** | (2026.01) |

(52) U.S. Cl.

CPC .......... *H10W 74/129* (2026.01); *H10D 89/10* (2025.01); *H10W 44/20* (2026.01); *H10W 70/635* (2026.01); *H10W 72/30* (2026.01); *H10W 90/701* (2026.01); *H10W 44/209* (2026.01); *H10W 44/234* (2026.01); *H10W 90/724* (2026.01)

(58) Field of Classification Search

None

See application file for complete search history.

(56) References Cited

U.S. PATENT DOCUMENTS

| | | | | |
|---|---|---|---|---|
| 2008/0129408 | A1* | 6/2008 | Nagaishi | H01P 5/107 333/32 |
| 2017/0324160 | A1* | 11/2017 | Khoury | H01Q 1/526 |
| 2020/0144985 | A1 | 5/2020 | Bulger | |
| 2021/0036405 | A1 | 2/2021 | Han et al. | |
| 2021/0218127 | A1 | 7/2021 | Lampersberger et al. | |
| 2022/0255577 | A1 | 8/2022 | Young | |
| 2023/0088569 | A1* | 3/2023 | Dutta | H10D 86/201 257/350 |

* cited by examiner

*Primary Examiner* — Jay C Chang

(74) *Attorney, Agent, or Firm* — Merchant & Gould P.C.

(57) ABSTRACT

A device including a substrate, a front-end module circuit situated over the substrate and configured to provide radio frequency communications, and a wafer-level chip-scale package circuit situated over the front-end module circuit and connected to the front-end module circuit and configured to provide passive components for radio frequency communications.

20 Claims, 12 Drawing Sheets

MILLIMETER-WAVE PASSIVE CIRCUIT DESIGNS WITH WAFER-LEVEL CHIP-SCALE PACKAGE

BACKGROUND

Often, in high-frequency circuit operations, such as in millimeter wavelength circuit operations, signal losses become a serious problem. Typically, in millimeter wavelength circuits, an on-chip front-end device is electrically connected to off-chip passive components, such as matching networks, power combiners, and an antenna. The on-chip front-end device includes radio frequency (RF) communications circuits, such as millimeter wavelength communications circuits that operate in the 30-300 gigahertz (GHz) frequency range. However, signal losses between the on-chip front-end circuits and the off-chip passive components become significant at the millimeter wavelength frequencies. To compensate for these losses, stringent design specifications are used for power amplifiers (PAs) and low-noise amplifiers (LNAs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

DETAILED DESCRIPTION

Figure 1:
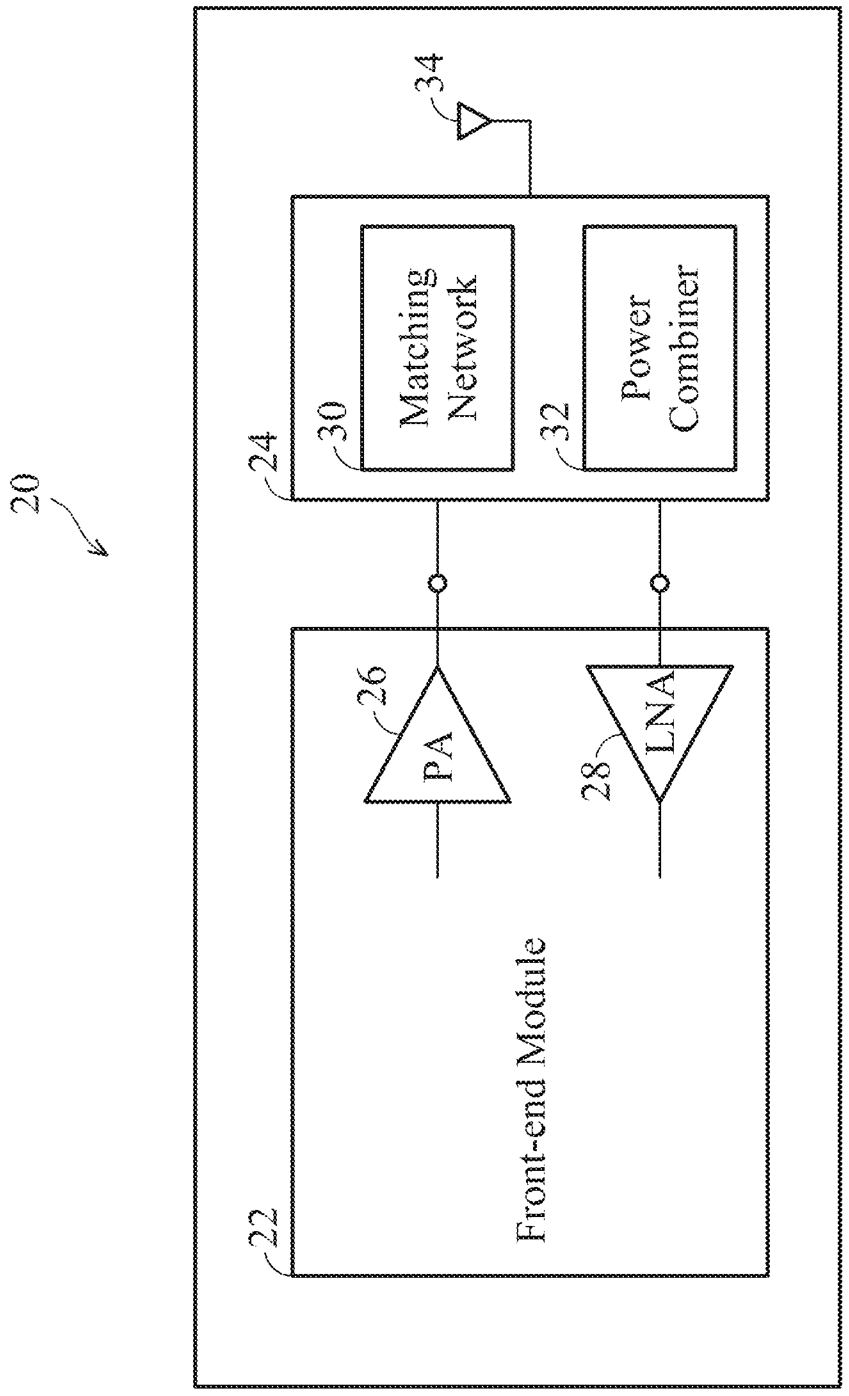
FIG. 1 is a diagram schematically illustrating a semiconductor device that includes a front-end module circuit and a wafer-level chip-scale package (WLCSP) circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed embodiments provide a front-end module circuit that operates in the millimeter wavelength frequency range integrated with a wafer-level chip-scale package (WLCSP) circuit that includes passive components or portions of passive components, such as matching networks, power combiners, and antenna for phased-array antenna operations. The front-end module circuit and the WLCSP circuit are integrated into the same semiconductor die.

The WLCSP circuit is manufactured in a far back-end package process that builds the semiconductor die up from an initial complementary metal-oxide-semiconductor (CMOS) circuit. The WLCSP circuit includes passive metal layers for chip-scale package interconnections to reduce parasitic components, such as resistances, capacitances, and inductances, from the semiconductor die to a printed circuit board (PCB). In disclosed embodiments, these passive metal layers are used in the WLCSP circuit to provide passive components for the RF millimeter wavelength applications.

Thus, disclosed embodiments realize passive circuit designs, such as the matching networks, the power combiners, and the antenna, in the WLCSP circuit and integrate the WLCSP circuit with the front-end module circuit, such as a CMOS millimeter wavelength front-end module circuit.

With the WLCSP circuit, the front-end module circuit is fully integrated with the passive components of the WLCSP circuit to reduce high-frequency signal loss.

FIG. 1 is a diagram schematically illustrating a semiconductor device 20 that includes a front-end module circuit 22 and a WLCSP circuit 24, in accordance with some embodiments. The front-end module circuit 22 and the WLCSP circuit 24 are integrated with one another on the semiconductor device 20 and configured to provide RF communications. In some embodiments, each of the front-end module circuit 22 and the WLCSP circuit 24 is configured to provide millimeter wavelength communications, such as in the 30-300 GHz range.

The front-end module 22 includes a power amplifier (PA) 26 and a low-noise amplifier (LNA) 28. Each of the PA 26 and the LNA 28 is electrically connected to the WLCSP circuit 24 on the semiconductor die 20 and configured to operate in RF signal ranges. The PA 26 is configured to transmit RF signals to the WLCSP circuit 24 and the LNA 28 is configured to receive RF signals from the WLCSP circuit 24. In some embodiments, each of the PA 26 and the LNA 28 is configured to operate in the millimeter wavelength frequency range, such as 30-300 GHz. In some embodiments, the front-end module circuit 22 is situated over a substrate of the semiconductor die 20.

The WLCSP circuit 24 includes passive components or portions of passive components, such as a matching network 30, a power combiner 32, and an antenna 34. Each of the matching network 30 and the power combiner 32 is electrically connected to the front-end module circuit 22 and to the antenna 34. The matching network 30 and the power combiner 32 are configured to operate in the RF signal ranges and, in some embodiments, in the millimeter wavelength frequency range, such as 30-300 GHz. In some embodiments, the WLCSP circuit 24 is situated on or over the front-end module circuit 22. Also, in some embodiments, the front-end module circuit 22 is integrated with the antenna 34 and the related circuits, such as the matching network 30 and the power combiner 32 to provide phased array operations in a phased array architecture and reduce or prevent signal loss.

Figure 2:
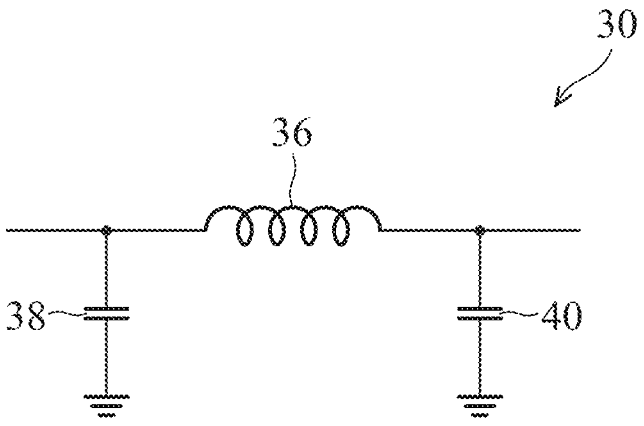
FIG. 2 is a diagram schematically illustrating an example of a matching network, in accordance with some embodiments.

FIG. 2 is a diagram schematically illustrating an example of a matching network 30, in accordance with some embodiments. The matching network 30 includes an inductor 36, a first capacitor 38, and a second capacitor 40. One end of the inductor 36 is connected to one end of the first capacitor 38 and the other end of the first capacitor 38 is connected to a reference, such as ground. The other end of the inductor 36 is connected to one end of the second capacitor 40 and the other end of the second capacitor 40 is connected to a reference, such as ground.

The matching network 30 provides impedance matching to improve power transfer between the front-end module circuit 22 and the antenna 34 using an interconnecting transmission line to the antenna 34. Signals on the transmission line are transmitted without reflections if the transmission line is terminated with a matching impedance, such as that provided by the matching network 30.

Figure 3:
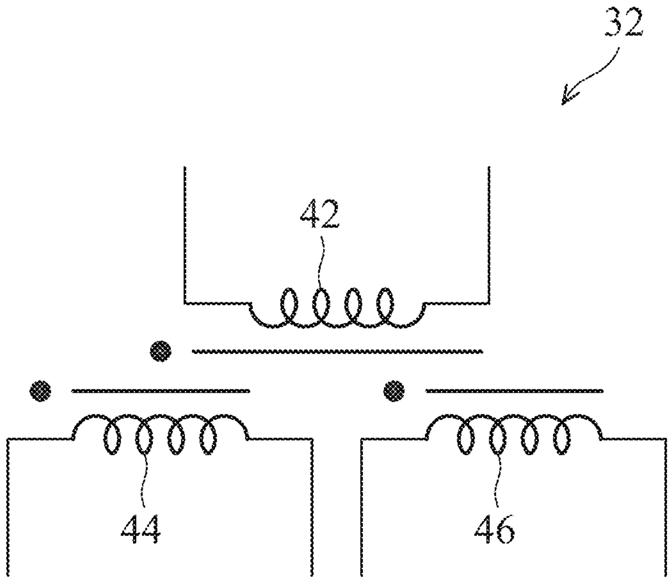
FIG. 3 is a diagram schematically illustrating an example of a power combiner, in accordance with some embodiments.

FIG. 3 is a diagram schematically illustrating an example of a power combiner 32, in accordance with some embodiments. The power combiner 32 includes a first transformer winding 42, a second transformer winding 44, and a third transformer winding 46. The first transformer winding 42, the second transformer winding 44, and the third transformer winding 36 are in-phase with one another. The second transformer winding 44 and the third transformer winding 46 transfer power to the first transformer winding 42. In some embodiments, the power combiner 32 can be used as a power divider, where the first transformer winding 42 transfers power to the second transformer winding 44 and to the third transformer winding 46. In some embodiments, the power combiner 32 is realized or made by using transmission lines.

Figure 4:
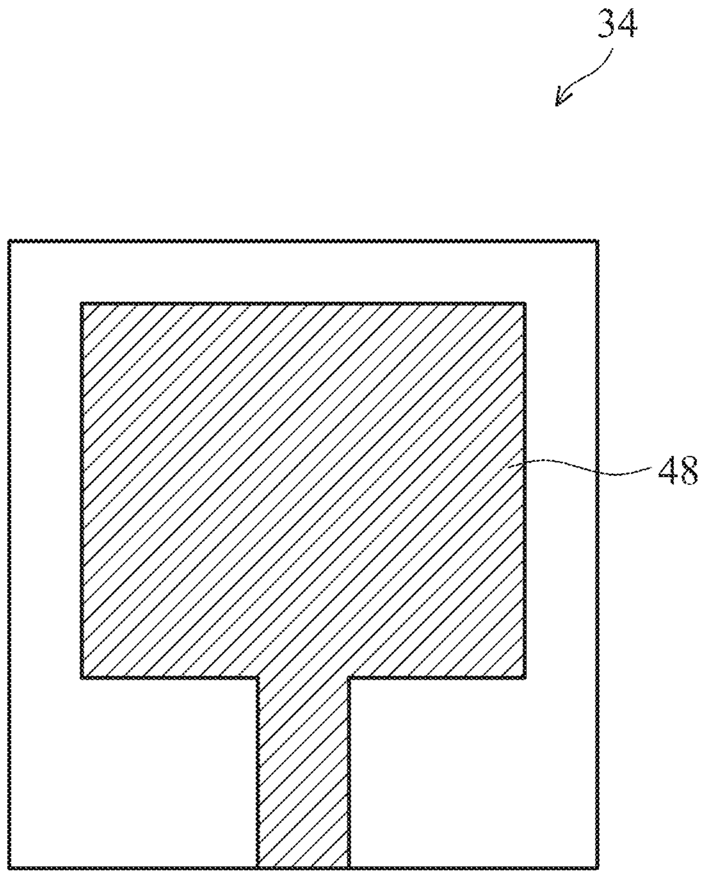
FIG. 4 is a diagram schematically illustrating an example of an antenna, in accordance with some embodiments.

FIG. 4 is a diagram schematically illustrating an example of an antenna 34, in accordance with some embodiments. In some embodiments, the WLCSP circuit 24 includes a redistribution layer (RDL) and the antenna 34 includes at least a portion of the redistribution layer 48. Also, in some embodiments, the matching network 30 includes at least a portion of the redistribution layer that is in the WLCSP circuit 24 and, in some embodiments, the power combiner includes at least a portion of the redistribution layer that is in the circuit 24. In some embodiments, the antenna 34 is in the form of a patch antenna. In some embodiments, the antenna 34 is in the form of a dipole antenna.

Figure 5:
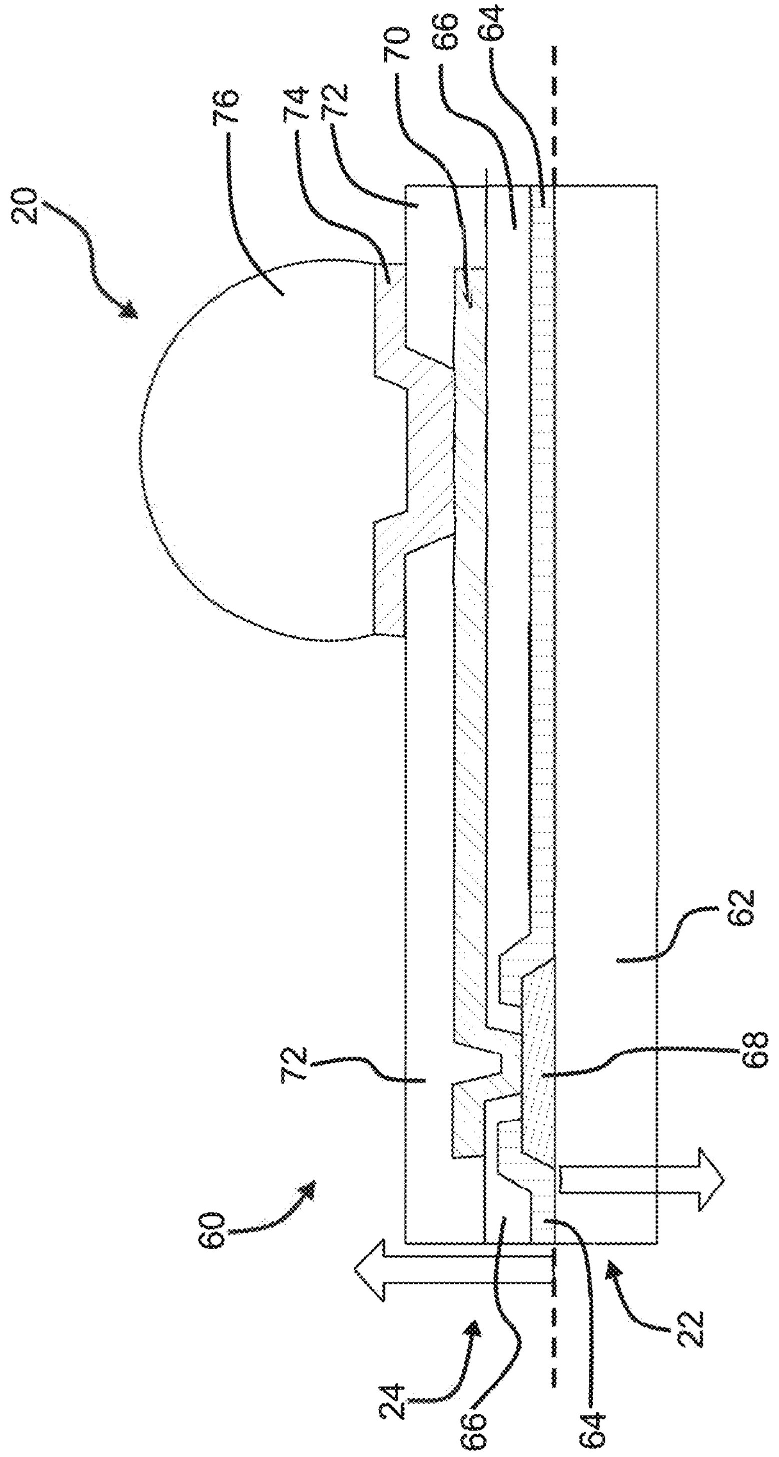
FIG. 5 is a diagram schematically illustrating an example cross-section of the semiconductor die of FIG. 1, in accordance with some embodiments.

FIG. 5 is a diagram schematically illustrating an example cross-section 60 of the semiconductor die 20 of FIG. 1, in accordance with some embodiments. The semiconductor die 20 includes the front-end module circuit 22 and the WLCSP circuit 24 (shown in FIG. 1).

The cross-section 60 of the semiconductor die 20 includes a substrate 62, such that the front-end module circuit 22 is formed over, on, and/or in the substrate 62 and supported by the substrate 62. With the front-end module circuit 22 situated over or on the substrate 62, a passivation layer 64 is disposed or formed over the substrate 62 and the front-end module circuit 22. In some embodiments, the substrate 62 is silicon. In some embodiments, the passivation layer 64 is an oxide layer.

The semiconductor die 20 and the WLCSP circuit 24 include a first dielectric layer 66 that is disposed or formed on the passivation layer 64. An aluminum pad 68 is connected to the front-end module circuit 22 and a gap is formed in the passivation layer 64 and the first dielectric layer 66 over the aluminum pad 68. An RDL 70 is formed on the first dielectric layer 66 and through the gap formed in the passivation layer 64 and the first dielectric layer 66 to contact the aluminum pad 68 and the front-end module circuit 22. A second dielectric layer 72 is disposed or formed over the RDL 70 and the first dielectric layer 66. Also, an under-bump metal (UBM) 74 is formed through a gap in the second dielectric layer 72 to contact the RDL 70. A solder ball 76 is disposed on and connected to the UBM 74 for contacting circuits outside the semiconductor die 20. In some embodiments, the first dielectric layer 66 is a polybenzoxazoles (PBO) layer and, in some embodiments, the second dielectric layer 72 is a PBO layer. Also, in some embodiments, the RDL 70 is made from copper and, in some embodiments, the UBM 74 is a thin-film metal layer stack.

The passive components of the WLCSP circuit 24 (shown in FIGS. 2-4), including the matching network 30, the power combiner 32, and the antenna 34, can be made from the RDL 70 or a portion of the RDL 70 and the UBM 74. Where, due to greater vertical spacing from the substrate 62, the quality factor of each of the passive components in the WLCSP circuit 24 is fundamentally improved. In some embodiments, the inductor 36, and/or at least one of the capacitors 38 and 40 is made from the RDL 70 or a portion of the RDL 70 and the UBM 74. In some embodiments, at least one and up to all the transformers 42, 44, and 46 are made from the RDL 70 or a portion of the RDL 70 and the UBM 74.

Figure 6:
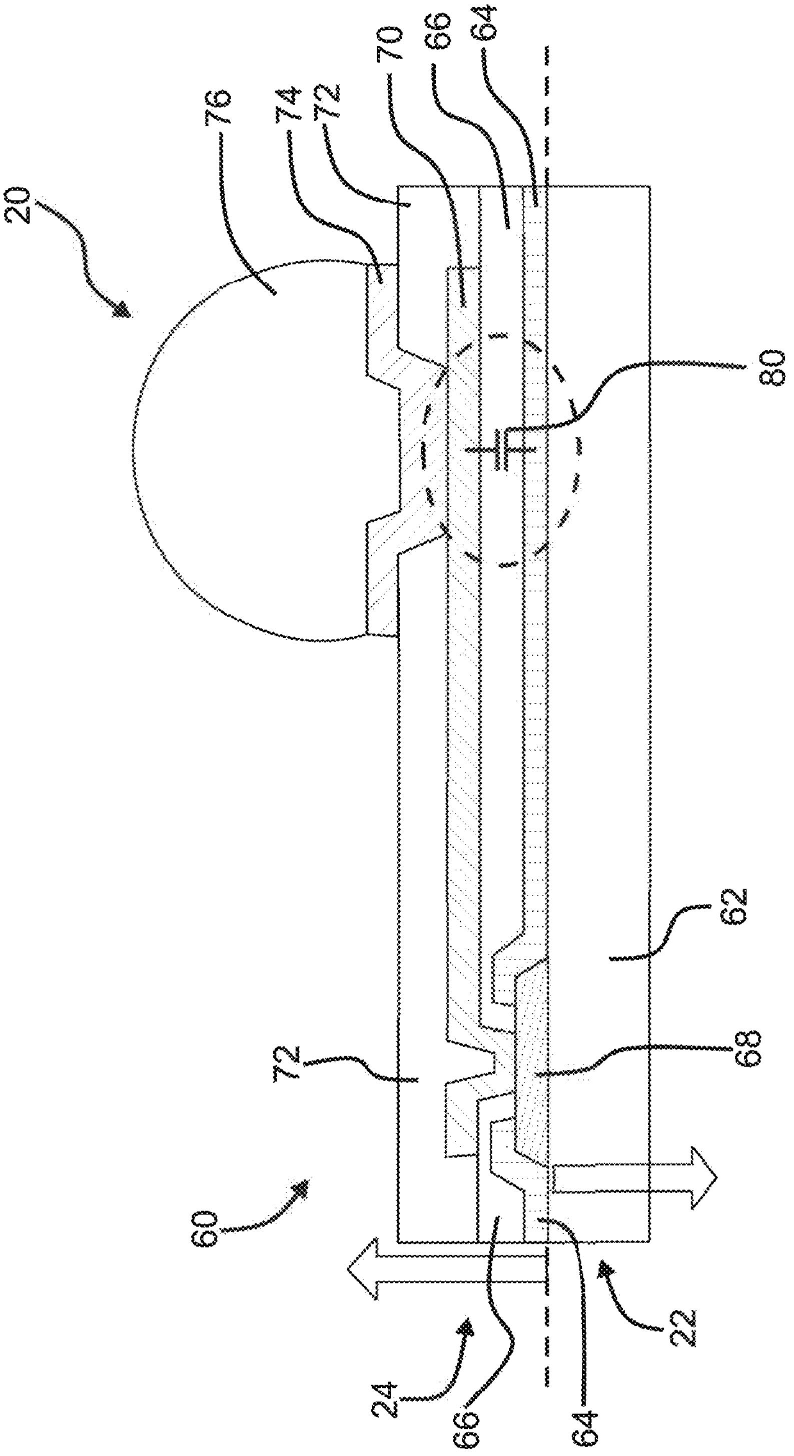
FIG. 6 is a diagram schematically illustrating the cross-section of the semiconductor die with a capacitor made from the redistribution layer (RDL) or a portion of the RDL and the under bump metal (UBM), in accordance with some embodiments.

FIG. 6 is a diagram schematically illustrating the cross-section 60 of the semiconductor die 20 with a capacitor 80 made from the RDL 70 or a portion of the RDL 70 and the UBM 74, in accordance with some embodiments. The capacitor 80 can be used in the matching network 30 or the power combiner 32. In some embodiments, the capacitor 80 is one of the capacitors 38 and 40 in the matching network 30. In some embodiments, the capacitor 80 is realized using the coupling between the RDL 70 in the WLCSP circuit 24 and a routing layer, such as an aluminum layer in or on the substrate 62.

Figure 7:
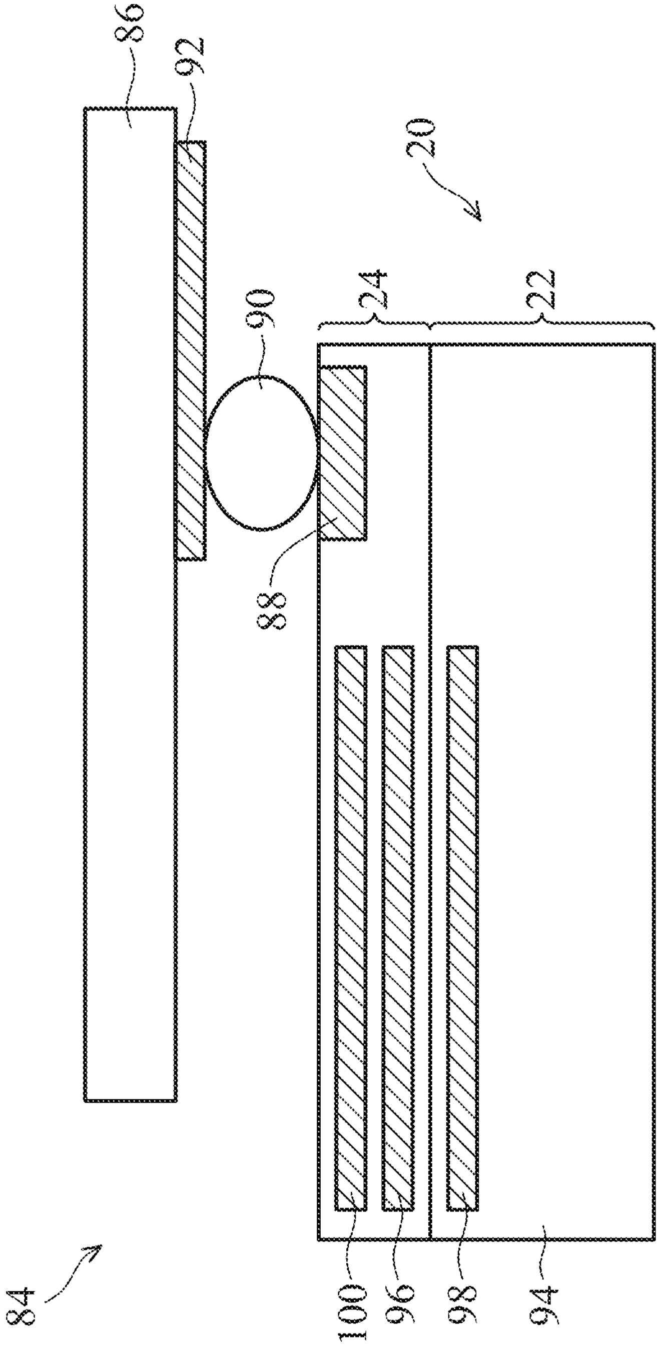
FIG. 7 is a diagram schematically illustrating across-section of the semiconductor die and a printed circuit board (PCB), in accordance with some embodiments.

FIG. 7 is a diagram schematically illustrating a cross-section 84 of the semiconductor die 20 and a printed circuit board (PCB) 86, in accordance with some embodiments. The cross-section 84 of the semiconductor die 20 includes the WLCSP circuit 24 situated on and over the front-end module circuit 22. The WLCSP circuit 24 includes UBM 88 electrically connected to a solder ball 90 that is electrically connected to a solder ball electrical contact 92 of the PCB 86 to make electrical contact between the semiconductor die 20 and the PCB 86.

The cross-section 84 of the semiconductor die 20 includes a substrate 94, such that the front-end module circuit 22 is formed over, on, and/or in the substrate 94 and supported by the substrate 94. With the front-end module circuit 22 situated over the substrate 94, the WLCSP circuit 24 is disposed on or formed over the substrate 94 and the front-end module circuit 22. In some embodiments, the substrate 94 is silicon.

The passive components of the WLCSP circuit 24, including the matching network 30 and the power combiner 32 (shown in FIGS. 2 and 3), can be made from an RDL 96 or a portion of the RDL 96 and the UBM 88 of the WLCSP circuit 24. The antenna 34 can be made from an RDL 100 or a portion of the RDL 100 and the UBM 88 in the WLCSP circuit 24. In other embodiments, at least a portion of at least one of the passive components of the WLCSP circuit 24, such as at least a portion of the matching network 30 and/or the power combiner 32, can be made from metal layers 98 in the substrate 94.

The WLCSP circuit 24 enables area-efficient RF front-end module circuit 22, including millimeter wavelength front-end module circuit 22, integration by allowing low-loss passive structures in the WLCSP circuit 24, a signal shield in one or more metal layers of the semiconductor die 20, and digital and analog circuitry built with lower-level metals in the semiconductor die 20.

Figure 8:
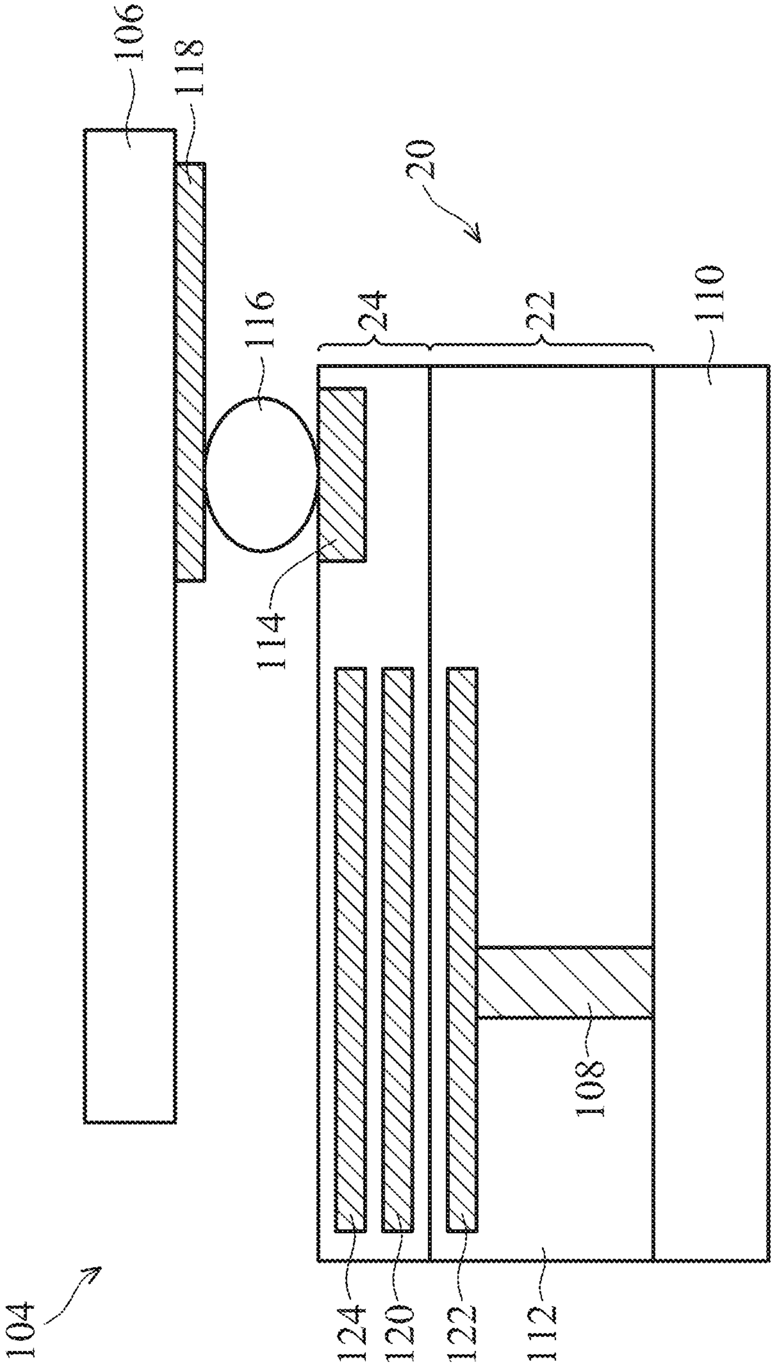
FIG. 8 is a diagram schematically illustrating a cross-section of the semiconductor die of FIG. 1 and a PCB, where the semiconductor die includes a through-silicon-via (TSV) and a backside WLCSP circuit, in accordance with some embodiments.

FIG. 8 is a diagram schematically illustrating a cross-section 104 of the semiconductor die 20 of FIG. 1 and a PCB 106, where the semiconductor die 20 includes a through-silicon-via (TSV) 108 and a backside WLCSP circuit 110, in accordance with some embodiments. The cross-section 104 of the semiconductor die 20 includes the frontside WLCSP circuit 24 situated on and over the front-end module circuit 22 (shown in FIG. 1). The TSV 108 extends through the substrate 112 of the semiconductor die 20 from the front-end module circuit 22 and/or the frontside WLCSP circuit 24 to the backside WLCSP circuit 110. With the TSV 108, the backside WLCSP circuit 110 can provide routing for passive components, such as the matching network 30, the power combiner 32, and the antenna 34 (shown in FIGS. 1-4).

The frontside WLCSP circuit 24 includes UBM 114 electrically connected to a solder ball 116 that is electrically connected to a solder ball electrical contact 118 of the PCB 106 to make electrical contact between the semiconductor die 20 and the PCB 106. Also, the cross-section 104 of the semiconductor die 20 includes the substrate 112, such that the front-end module circuit 22 is formed over, on, and/or in the substrate 112 and supported by the substrate 112. With the front-end module circuit 22 situated over the substrate 112, the frontside WLCSP circuit 24 is disposed on and/or formed over the substrate 112 and the front-end module circuit 22.

The passive components, including the matching network 30 and the power combiner 32 (shown in FIGS. 2 and 3), can be made from an RDL 120 or a portion of the RDL 120 and the UBM 114 of the frontside WLCSP circuit 24, from metal layers 122 in the substrate 112, and/or from the backside WLCSP circuit 110 through the TSV 108. Also, the antenna 34 can be made from an RDL 124 or a portion of the RDL 124 and the UBM 114 in the frontside WLCSP circuit 24. and/or from the backside WLCSP circuit 110 through the TSV 108.

Figure 9:
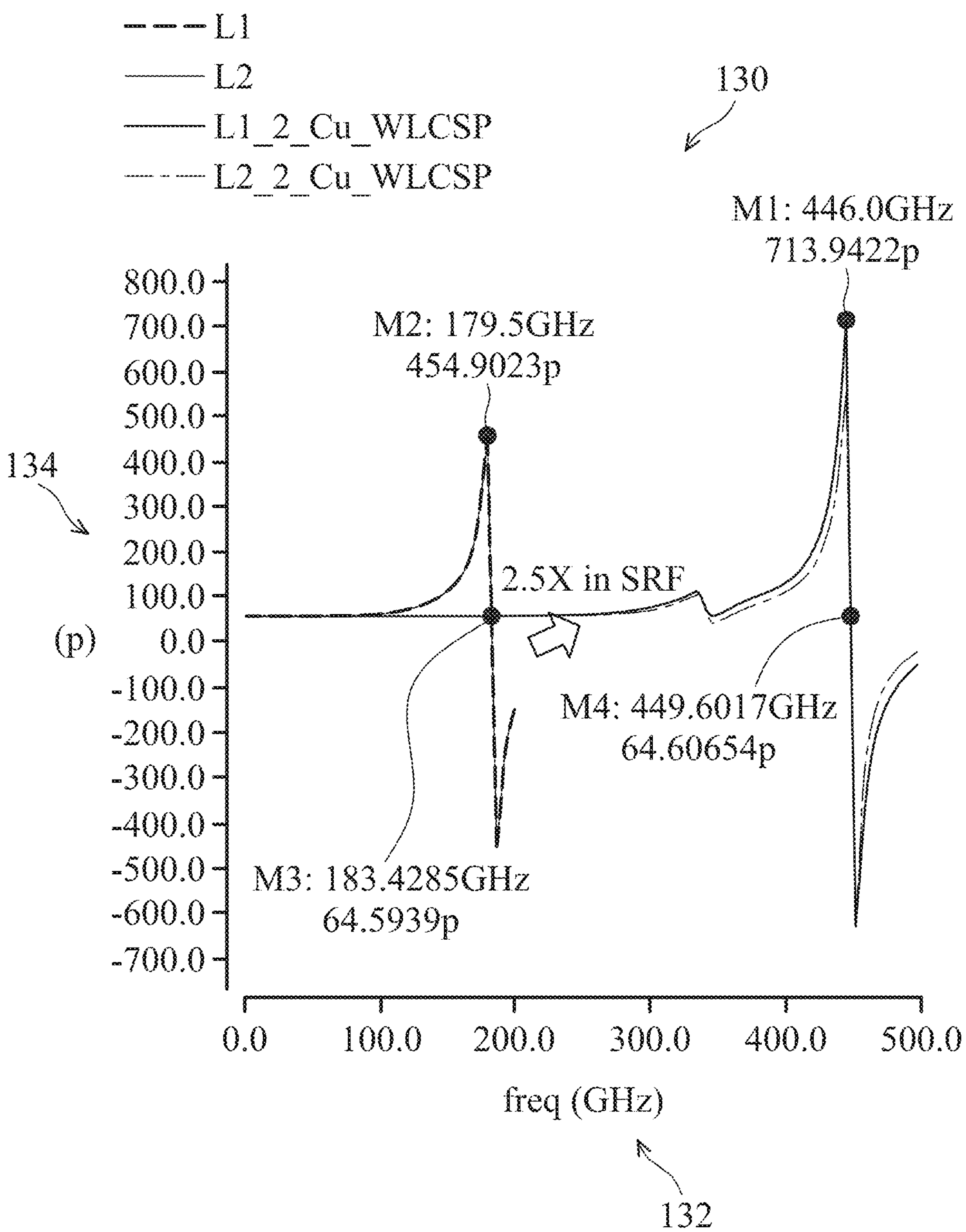
FIG. 9 is a diagram schematically illustrating a graph of simulations of the self-resonant frequency (SRF) of four inductors, in accordance with some embodiments.

FIG. 9 is a diagram schematically illustrating a graph 130 of simulations of the self-resonant frequency (SRF) of four inductors, in accordance with some embodiments. Two of the inductors L1 and L2 were made from a complementary metal-oxide semiconductor (CMOS) process and not from an RDL of a WLCSP circuit. The other two inductors L1_2 and L2_2 were made from the RDL of a WLCSP circuit, such as from the RDL 70 of the WLCSP circuit 24 (shown in FIG. 5). The graph 130 has frequency in giga-Hertz (GHz) graphed along the x-axis 132 and inductance in pico-Henries (p) graphed along the y-axis 134.

The SRF of each of the CMOS inductors L1 and L2 is about 183 GHz and the SRF of each of the WLCSP inductors L1_2 and L2_2 is about 449.6 GHz. Thus, using the RDL of the WLCSP circuit to make the inductors L1_2 and L2_2 increased the SRF by a factor of about 2.5 times. This is due to the greater vertical spacing from the substrate in the inductors L1_2 and L2_2 made from the RDL of the WLCSP circuit.

Figure 10:
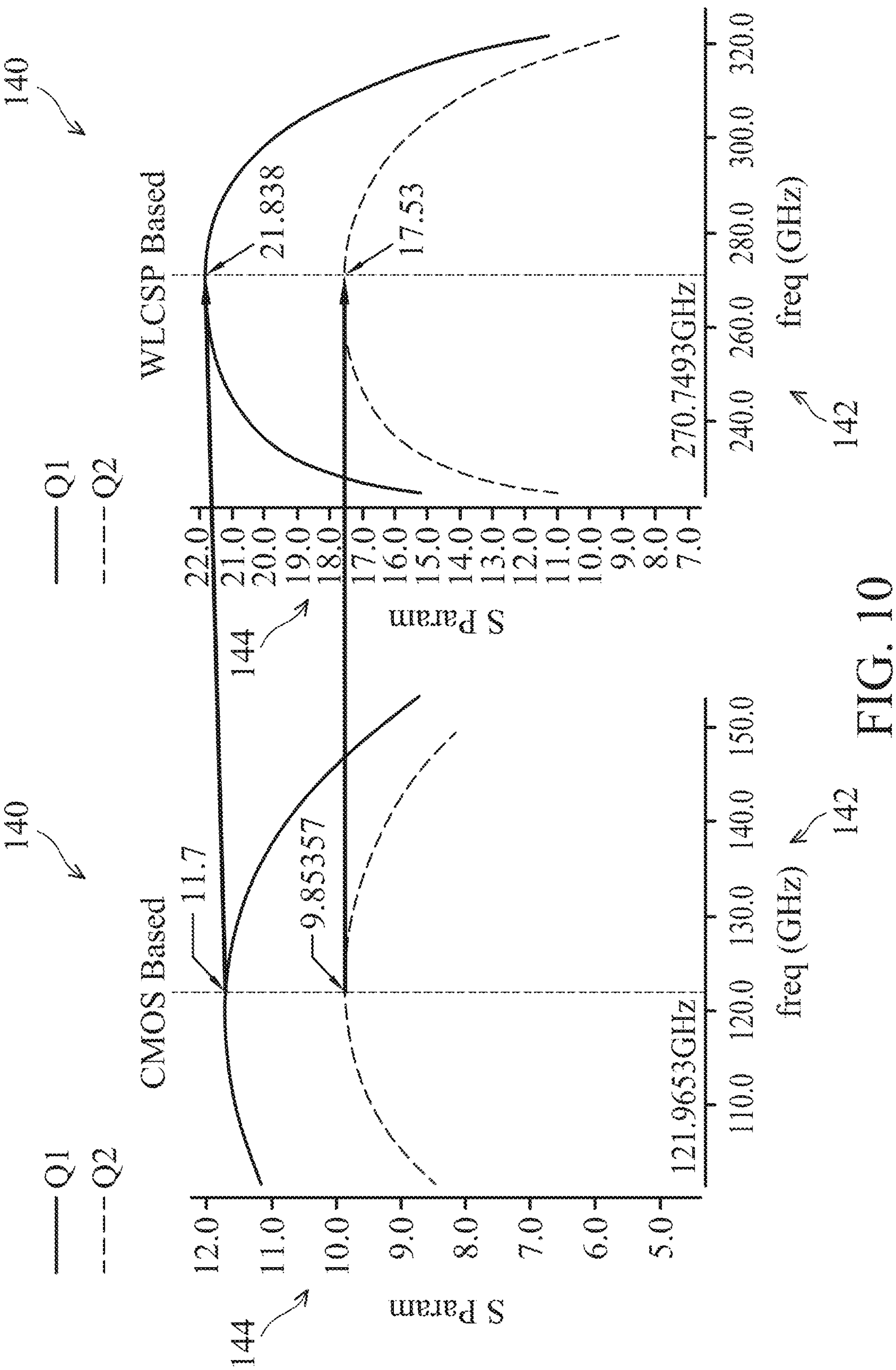
FIG. 10 is a diagram schematically illustrating graphs of the Q-factors of the CMOS based inductors L1 and L2 and the Q-factors of the WLCSP based inductors L1_2 and L2_2, in accordance with some embodiments.

FIG. 10 is a diagram schematically illustrating graphs 140 of the Q-factors of the CMOS based inductors L1 and L2 and the Q-factors of the WLCSP based inductors L1_2 and L2_2, in accordance with some embodiments. The graph on the left illustrates the Q-factors Q1 and Q2 of the CMOS based inductors L1 and L2, and the graph on the right illustrates the Q-factors Q1 and Q2 of the WLCSP based inductors L1_2 and L2_2. The graphs 140 have frequency in giga-Hertz (GHz) graphed along each of the x-axes 142 and s-parameters (Q-factor) graphed along each of the y-axes 144.

The Q-factor of the CMOS inductor L1 is about 11.7 at about 122 GHz and the Q-factor of the CMOS inductor L2 is about 9.85 at about 122 GHz. The Q-factor of the WLCSP inductor L1_2 is about 21.8 at about 270.7 GHz and the Q-factor of the CMOS inductor L2_2 is about 17.5 at 270.7 GHz. Thus, using the RDL of the WLCSP circuit to make the WLCSP inductors L1_2 and L2_2 enhances the Q-factor frequency, such as beyond 120 GHz, and increases each of the Q-factors by a factor of about 2 times. This is due to the greater vertical spacing from the substrate in the inductors L1_2 and L2_2 made from the RDL of the WLCSP circuit.

Figure 11:
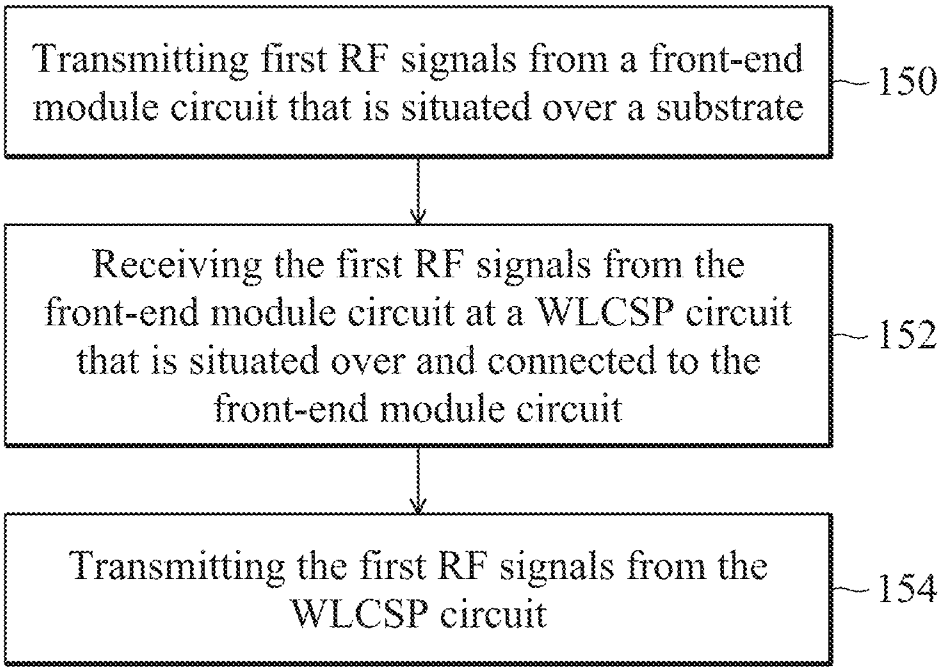
FIG. 11 is a diagram schematically illustrating a method of operating a device, in accordance with some embodiments.

FIG. 11 is a diagram schematically illustrating a method of operating a device, in accordance with some embodiments. At step 150, the method includes transmitting first RF signals from a front-end module circuit that is situated over a substrate. In some embodiments, the front-end module circuit is like the front-end module circuit 22 (shown in FIGS. 1 and 5-8). In some embodiments, the substrate is like the substrate 62 (shown in FIG. 5), the substrate 94 (shown in FIG. 7), and/or the substrate 112 (shown in FIG. 8). In some embodiments, the first RF signals are millimeter wave-length signals, such as in the 30-300 GHz frequency range.

At step 152, the method includes receiving the first RF signals from the front-end module circuit at a WLCSP circuit that is situated over the front-end module circuit and connected to the front-end module circuit. At step 154, the method includes transmitting the first RF signals from the WLCSP circuit. In some embodiments, the WLCSP circuit is like the WLCSP circuit 24 (shown in FIGS. 1 and 5-8).

In some embodiments, the method further includes receiving second RF signals at the WLCSP circuit, transmitting the second RF signals from the WLCSP circuit to the front-end module circuit, and receiving the second RF signals at the front-end module circuit. In some embodiments, the second RF signals are millimeter wave-length signals, such as in the 30-300 GHz frequency range.

In some embodiments, receiving the first RF signals from the front-end module circuit at the WLCSP circuit and transmitting the first RF signals from the WLCSP circuit includes communicating the first RF signals through at least part of an RDL in the WLCSP circuit. In some embodiments, communicating the first RF signals through at least part of the RDL includes communicating the first RF signals through at least part of a copper RDL or a capacitor that includes the RDL.

Figure 12:
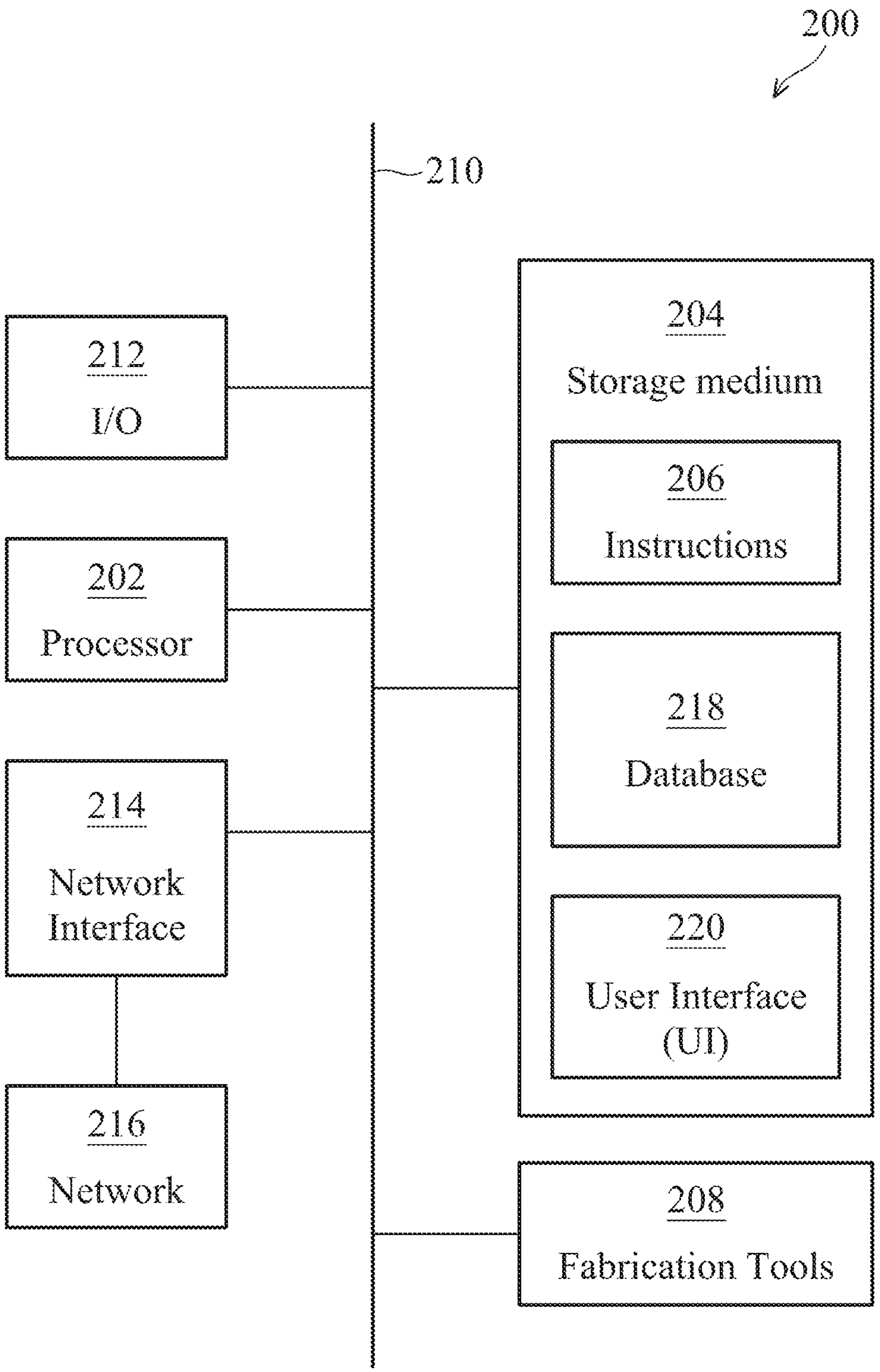
FIG. 12 is a block diagram schematically illustrating an example of a computer system configured to provide the semiconductor devices and methods of the current disclosure, in accordance with some embodiments.

FIG. 12 is a block diagram schematically illustrating an example of a computer system 200 configured to provide the semiconductor devices and methods of the current disclosure, in accordance with some embodiments. Some or all the design, layout, and manufacture of the semiconductor devices, also referred to as semiconductor circuits, can be performed by or with the computer system 200. In some embodiments, the computer system 200 includes an electronic design automation (EDA) system. In some embodiments, the semiconductor devices are ICs.

In some embodiments, the system 200 is a general-purpose computing device including a processor 202 and a non-transitory, computer-readable storage medium 204. The computer-readable storage medium 204 may be encoded with, e.g., store, computer program code such as executable instructions 206. Execution of the instructions 206 by the processor 202 provides (at least in part) a design tool that implements a portion or all the functions of the system 200, such as pre-layout simulations, post-layout simulations, routing, rerouting, and final layout for manufacturing. Further, fabrication tools 208 are included to further layout and physically implement the design and manufacture of the semiconductor devices. In some embodiments, the system 200 includes a commercial router. In some embodiments, the system 200 includes an automatic place and route (APR) system.

The processor 202 is electrically coupled to the computer-readable storage medium 204 by a bus 210 and to an I/O interface 212 by the bus 210. A network interface 214 is also electrically connected to the processor 202 by the bus 210. The network interface 214 is connected to a network 216, so that the processor 202 and the computer-readable storage medium 204 can connect to external elements using the network 216. The processor 202 is configured to execute the computer program code or instructions 206 encoded in the computer-readable storage medium 204 to cause the system 200 to perform a portion or all the functions of the system 200, such as providing the semiconductor devices and methods of the current disclosure and other functions of the system 200. In some embodiments, the processor 202 is a central processing unit (CPU), a multi-processor, a distributed processing system, an application specific integrated circuit (ASIC), and/or a suitable processing unit.

In some embodiments, the computer-readable storage medium 204 is an electronic, magnetic, optical, electromagnetic, infrared, and/or semiconductor system or apparatus or device. For example, the computer-readable storage medium 204 can include a semiconductor or solid-state memory, a magnetic tape, a removable computer diskette, a random-access memory (RAM), a read-only memory (ROM), a rigid magnetic disk, and/or an optical disk. In some embodiments using optical disks, the computer-readable storage medium 204 can include a compact disk read only memory (CD-ROM), a compact disk read/write memory (CD-R/W), and/or a digital video disc (DVD).

In some embodiments, the computer-readable storage medium 204 stores computer program code or instructions 206 configured to cause the system 200 to perform a portion or all the functions of the system 200. In some embodiments, the computer-readable storage medium 204 also stores information which facilitates performing a portion or all the functions of the system 200. In some embodiments, the computer-readable storage medium 204 stores a database 218 that includes one or more of component libraries, digital circuit cell libraries, and databases.

The system 200 includes the I/O interface 212, which is coupled to external circuitry. In some embodiments, the I/O interface 212 includes a keyboard, keypad, mouse, trackball, trackpad, touchscreen, and/or cursor direction keys for communicating information and commands to the processor 202.

The network interface 214 is coupled to the processor 202 and allows the system 200 to communicate with the network 216, to which one or more other computer systems are connected. The network interface 214 can include: wireless network interfaces such as BLUETOOTH, WIFI, WIMAX, GPRS, or WCDMA; or wired network interfaces such as ETHERNET, USB, or IEEE-1364. In some embodiments, a portion or all the functions of the system 200 can be performed in two or more systems that are like system 200.

The system 200 is configured to receive information through the I/O interface 212. The information received through the I/O interface 212 includes one or more of instructions, data, design rules, libraries of components and cells, and/or other parameters for processing by the processor 202. The information is transferred to the processor 202 by the bus 210. Also, the system 200 is configured to receive information related to a user interface (UI) through the I/O interface 212. This UI information can be stored in the computer-readable storage medium 204 as a UI 220.

In some embodiments, a portion or all the functions of the system 200 are implemented via a standalone software application for execution by a processor. In some embodiments, a portion or all the functions of the system 200 are implemented in a software application that is a part of an additional software application. In some embodiments, a portion or all the functions of the system 200 are implemented as a plug-in to a software application. In some embodiments, at least one of the functions of the system 200 is implemented as a software application that is a portion of an EDA tool. In some embodiments, a portion or all the functions of the system 200 are implemented as a software application that is used by the system 200. In some embodiments, a layout diagram is generated using a tool such as VIRTUOSO available from CADENCE DESIGN SYSTEMS, Inc., or another suitable layout generating tool.

In some embodiments, the routing, layouts, and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a digital video disc or a digital versatile disc (DVD), a magnetic disk such as a hard disk, a semiconductor memory such as a ROM and a RAM, and a memory card, and the like.

As noted above, embodiments of the system 200 include fabrication tools 208 for implementing the manufacturing processes of the system 200. For example, based on the final layout, photolithographic masks may be generated, which are used to fabricate the semiconductor device by the fabrication tools 208.

Figure 13:
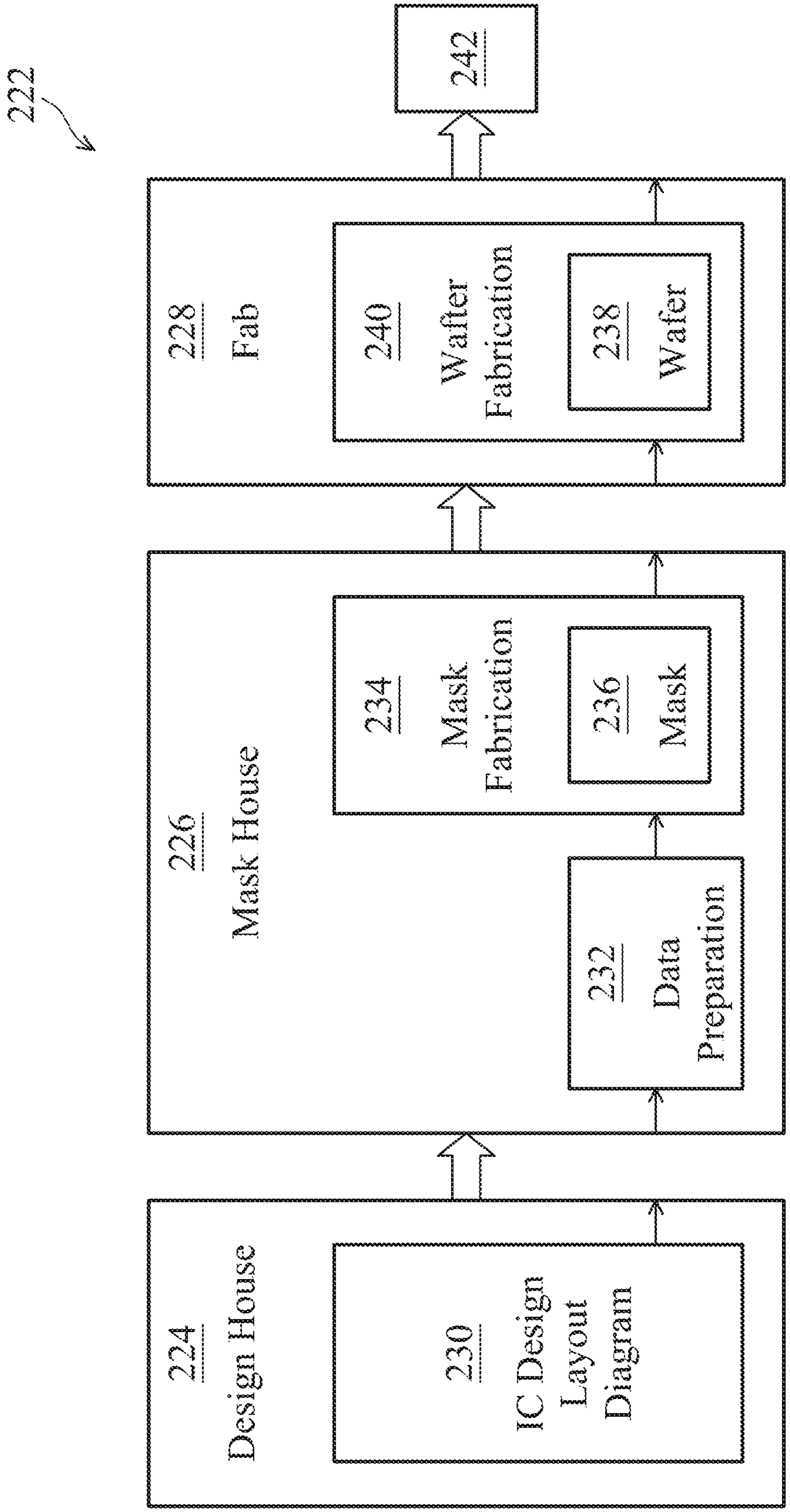
FIG. 13 is a block diagram of a semiconductor device manufacturing system and a semiconductor device manufacturing flow associated therewith, in accordance with some embodiments.

Further aspects of device fabrication are disclosed in conjunction with FIG. 13, which is a block diagram of a semiconductor device manufacturing system 222 and a semiconductor device manufacturing flow associated therewith, in accordance with some embodiments. In some embodiments, based on a layout diagram, one or more semiconductor masks and/or at least one component in a layer of a semiconductor device is fabricated using the manufacturing system 222.

In FIG. 13, the semiconductor device manufacturing system 222 includes entities, such as a design house 224, a mask house 226, and a semiconductor device manufacturer/fabricator ("Fab") 228, that interact with one another in the design, development, and manufacturing cycles and/or services related to manufacturing a semiconductor device, such as the semiconductor devices described herein. The entities in the system 222 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of the design house 224, the mask house 226, and the semiconductor device fab 228 are owned by a single larger company. In some embodiments, two or more of the design house 224, the mask house 226, and the semiconductor device fab 228 coexist in a common facility and use common resources.

The design house (or design team) 224 generates a semiconductor device design layout diagram 230. The semiconductor device design layout diagram 230 includes various geometrical patterns, or semiconductor device layout diagrams designed for a semiconductor device. The geometrical patterns correspond to patterns of metal, oxide, or semiconductor layers that make up the various components of the semiconductor structures to be fabricated. The various layers combine to form various semiconductor device features. For example, a portion of the semiconductor device design layout diagram 230 includes various semiconductor device features, such as diagonal vias, active areas or regions, gate electrodes, sources, drains, metal lines, local vias, and openings for bond pads, to be formed in a semiconductor substrate (such as a silicon wafer) and in various material layers disposed on the semiconductor substrate. The design house 224 implements a design procedure to form a semiconductor device design layout diagram 230. The semiconductor device design layout diagram 230 is presented in one or more data files having information of the geometrical patterns. For example, semiconductor device design layout diagram 230 can be expressed in a GDSII file format or DFII file format. In some embodiments, the design procedure includes one or more of analog circuit design, digital circuit design, logic circuit design, standard cell circuit design, power distribution network (PDN) design including power via design, supply voltage track design, reference voltage track design, place and route routines, and physical layout designs.

The mask house 226 includes data preparation 232 and mask fabrication 234. The mask house 226 uses the semiconductor device design layout diagram 230 to manufacture one or more masks 236 to be used for fabricating the various layers of the semiconductor device or semiconductor structure. The mask house 226 performs mask data preparation 232, where the semiconductor device design layout diagram 230 is translated into a representative data file (RDF). The mask data preparation 232 provides the RDF to the mask fabrication 234. The mask fabrication 234 includes a mask writer that converts the RDF to an image on a substrate, such as a mask (reticle) 236 or a semiconductor wafer 238. The design layout diagram 230 is manipulated by the mask data preparation 232 to comply with characteristics of the mask writer and/or criteria of the semiconductor device fab 228. In FIG. 13, the mask data preparation 232 and the mask fabrication 234 are illustrated as separate elements. In some embodiments, the mask data preparation 232 and the mask fabrication 234 can be collectively referred to as mask data preparation.

In some embodiments, the mask data preparation 232 includes an optical proximity correction (OPC) which uses lithography enhancement techniques to compensate for image errors, such as those that can arise from diffraction, interference, other process effects and the like. The OPC adjusts the semiconductor device design layout diagram 230. In some embodiments, the mask data preparation 232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 232 includes a mask rule checker (MRC) that checks the semiconductor device design layout diagram 230 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the semiconductor device design layout diagram 230 to compensate for limitations during the mask fabrication 234, which may undo part of the modifications performed by OPC to meet mask creation rules.

In some embodiments, the mask data preparation 232 includes lithography process checking (LPC) that simulates processing that will be implemented by the semiconductor device fab 228. LPC simulates this processing based on the semiconductor device design layout diagram 230 to create a simulated manufactured device. The processing parameters in LPC simulation can include parameters associated with various processes of the semiconductor device manufacturing cycle, parameters associated with tools used for manufacturing the semiconductor device, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the semiconductor device design layout diagram 230.

The above description of mask data preparation 232 has been simplified for the purposes of clarity. In some embodiments, data preparation 232 includes additional features such as a logic operation (LOP) to modify the semiconductor device design layout diagram 230 according to manufacturing rules. Additionally, the processes applied to the semiconductor device design layout diagram 230 during data preparation 232 may be executed in a variety of different orders.

After the mask data preparation 232 and during the mask fabrication 234, a mask 236 or a group of masks 236 are fabricated based on the modified semiconductor device design layout diagram 230. In some embodiments, the mask fabrication 234 includes performing one or more lithographic exposures based on the semiconductor device design layout diagram 230. In some embodiments, an electron-beam (e-beam) or a mechanism of multiple e-beams is used to form a pattern on a mask (photomask or reticle) 236 based on the modified semiconductor device design layout diagram 230. The mask 236 can be formed in various technologies. In some embodiments, the mask 236 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 236 includes a transparent substrate (e.g., fused quartz) and an opaque material (e.g., chromium) coated in the opaque regions of the binary mask. In another example, the mask 236 is formed using a phase shift technology. In a phase shift mask (PSM) version of the mask 236, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 234 is used in a variety of processes. For example, such a mask(s) is used in an ion implantation process to form various doped regions in the semiconductor wafer 238, in an etching process to form various etching regions in the semiconductor wafer 238, and/or in other suitable processes.

The semiconductor device fab 228 includes wafer fabrication 240. The semiconductor device fab 228 is a semiconductor device fabrication business that includes one or more manufacturing facilities for the fabrication of a variety of different semiconductor device products. In some embodiments, the semiconductor device fab 228 is a semiconductor foundry. For example, there may be a manufacturing facility for the front end of line (FEOL) fabrication of a plurality of semiconductor device products, while a second manufacturing facility may provide the back end of line (BEOL) fabrication for the interconnection and packaging of the semiconductor device products, and a third manufacturing facility may provide other services for the foundry business.

The semiconductor device fab 228 uses the mask(s) 236 fabricated by the mask house 226 to fabricate the semiconductor structures or semiconductor devices 242 of the current disclosure. Thus, the semiconductor device fab 228 at least indirectly uses the semiconductor device design layout diagram 230 to fabricate the semiconductor structures or semiconductor devices 242 of the current disclosure. Also, the semiconductor wafer 238 includes a silicon substrate or other proper substrate having material layers formed thereon, and the semiconductor wafer 238 further includes one or more of various doped regions, dielectric features, multilevel interconnects, and the like (formed at subsequent manufacturing steps). In some embodiments, the semiconductor wafer 238 is fabricated by the semiconductor device fab 228 using the mask(s) 236 to form the semiconductor structures or semiconductor devices 242 of the current disclosure. In some embodiments, the semiconductor device fabrication includes performing one or more lithographic exposures based at least indirectly on the semiconductor device design layout diagram 230.

Disclosed embodiments of the present application provide a front-end module circuit that operates in the RF frequency range integrated with a WLCSP circuit that operates in the RF frequency range. The WLCSP circuit includes passive components or portions of passive components, such as matching networks, power combiners, and antenna. The front-end module circuit and the WLCSP circuit are integrated on the same semiconductor die. In some embodiments, the RF frequency range is in the millimeter wavelength frequency range. In some embodiments, the front-end module circuit and the WLCSP circuit provide phased-array antenna operations.

In some embodiments, the WLCSP circuit is manufactured in a far back-end package process on an original or initial CMOS circuit. The WLCSP circuit includes passive metal layers for chip-scale package interconnections to reduce parasitic components between the semiconductor die and a PCB. In disclosed embodiments, these passive metal layers are used in the WLCSP circuit to provide the passive components for the RF applications.

Thus, disclosed embodiments realize the passive circuits, such as the matching networks, the power combiners, and the antenna, in the WLCSP circuit and integrate the WLCSP circuit with the front-end module circuit, such as a CMOS millimeter wavelength front-end module circuit, where the front-end module circuit is fully integrated with the passive components of the WLCSP circuit to reduce high-frequency signal loss.

In accordance with some embodiments, a device includes a substrate, a front-end module circuit situated over the substrate and configured to provide radio frequency communications, and a wafer-level chip-scale package circuit situated over the front-end module circuit and connected to the front-end module circuit and configured to provide passive components for radio frequency communications.

In accordance with further embodiments, a circuit includes a substrate, a front-end module circuit situated over the substrate and including a radio frequency power amplifier and a radio frequency low noise amplifier, and a wafer-level chip-scale package circuit situated over the front-end module and connected to the front-end module and including a radio frequency matching network and an antenna.

In accordance with still further disclosed aspects, a method of operating a device includes transmitting first radio frequency signals from a front-end module circuit that is situated over a substrate, receiving the first radio frequency signals from the front-end module circuit at a wafer-level chip-scale package circuit that is situated over the front-end module circuit and connected to the front-end module circuit, and transmitting the first radio frequency signals from the wafer-level chip-scale package circuit.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a substrate;

a frontside;

a backside;

a front-end module circuit situated over the substrate and configured to provide radio frequency communications;

a wafer-level chip-scale package circuit situated over the frontside and over the front-end module circuit, and connected to the front-end module circuit and configured to provide passive components for the radio frequency communications, and a through-silicon-via extending through the substrate to the backside.

2. The device of claim 1, wherein the front-end module circuit is configured to provide millimeter wavelength communications.

3. The device of claim 1, wherein the radio frequency communications are millimeter wavelength communications.

4. The device of claim 1, wherein the front-end module circuit includes a radio frequency power amplifier.

5. The device of claim 1, wherein the front-end module circuit includes a radio frequency low-noise amplifier.

6. The device of claim 1, wherein the wafer-level chip-scale package circuit includes a radio frequency matching network.

7. The device of claim 1, wherein the wafer-level chip-scale package circuit includes a radio frequency power combiner circuit.

8. The device of claim 1, wherein the wafer-level chip-scale package circuit includes an antenna.

9. The device of claim 1, wherein the wafer-level chip-scale package circuit includes an antenna for phased-array communications.

10. The device of claim 1, wherein the wafer-level chip-scale package circuit includes a redistribution layer that is part of at least one of a radio frequency matching network, a radio frequency power combiner, and an antenna.

11. The device of claim 1, comprising a backside wafer-level chip-scale package circuit connected to the through-silicon-via and configured to provide routing for the wafer-level chip-scale package circuit.

12. A circuit, comprising:

a substrate;

a frontside;

backside, a front-end module circuit situated over the substrate and including a radio frequency power amplifier and a radio frequency low noise amplifier;

a wafer-level chip-scale package circuit situated over the frontside and over the front-end module circuit, and connected to the front-end module and including a radio frequency matching network and an antenna; and a through-silicon-via extending through the substrate to the backside.

13. The circuit of claim 12, wherein the wafer-level chip-scale package circuit includes a radio frequency power combiner.

14. The circuit of claim 13, wherein the wafer-level chip-scale package circuit includes a redistribution layer that is part of at least one of the radio frequency matching network, the antenna, and the radio frequency power combiner.

15. The circuit of claim 13, wherein the wafer-level chip-scale package circuit includes a redistribution layer that is part of a capacitor in the radio frequency matching network or in the radio frequency power combiner.

16. The circuit of claim 12, comprising a backside wafer-level chip-scale package circuit connected to the through-silicon-via and configured to provide routing for the wafer-level chip-scale package circuit.

17. A method of operating a device, the method comprising:

transmitting first radio frequency signals from a front-end module circuit that is situated over a substrate, the front-end module circuit including a radio frequency power amplifier and a radio frequency low noise amplifier;

receiving the first radio frequency signals from the front-end module circuit at a wafer-level chip-scale package circuit that is situated over the front-end module circuit and connected to the front-end module circuit, wherein the water-level chip-scale package circuit is over a frontside and wherein a through-silicon-via extends through the substrate to a backside; and transmitting the first radio frequency signals from the wafer-level chip-scale package circuit.

18. The method of claim 17, comprising:

receiving second radio frequency signals at the wafer-level chip-scale package circuit;

transmitting the second radio frequency signals from the wafer-level chip-scale package circuit to the front-end module circuit; and receiving the second radio frequency signals at the front-end module circuit.

19. The method of claim 17, wherein receiving the first radio frequency signals and transmitting the first radio frequency signals from the wafer-level chip-scale package circuit includes communicating the first radio frequency signals through at least part of a redistribution layer in the wafer-level chip-scale package circuit.

20. The method of claim 19, wherein communicating the first radio frequency signals through at least part of the redistribution layer includes communicating the first radio frequency signals through at least part of a copper redistribution layer or a capacitor that includes the redistribution layer.

* * * * *